(12) United States Patent  
Isfort et al.

(10) Patent No.: US 7,800,871 B2  
(45) Date of Patent: Sep. 21, 2010

(54) RESISTIVE HIGH TEMPERATURE SUPERCONDUCTOR FAULT CURRENT LIMITER

(75) Inventors: Dirk Isfort, Heidenheim (DE); André Wolf, Oyten (DE)

(73) Assignee: Nexans, Paris (FR)

( * ) Notice: Subject to any disclaimer, the term of this patent is extended or adjusted under 35 U.S.C. 154(b) by 507 days.

(21) Appl. No.: 11/881,453

(22) Filed: Jul. 26, 2007

(65) Prior Publication Data

US 2008/0165455 A1 Jul. 10, 2008

(51) Int. Cl.
*H02H 7/00* (2006.01)
(52) U.S. Cl. ............................................. 361/19
(58) Field of Classification Search ............ 361/19
See application file for complete search history.

(56) References Cited

U.S. PATENT DOCUMENTS 5,761,017 A 6/1998 Hodge et al. ................ 361/19

6,271,475 B1 * 8/2001 Otto et al. ................ 174/125.1
6,433,974 B2 8/2002 Heissman ................... 361/19

FOREIGN PATENT DOCUMENTS

| DE | 10021082 | 2/2001 |
|---|---|---|
| DE | 19958727 | 6/2001 |
| EP | 1063712 | 12/2000 |
| JP | 10208909 | 8/1998 |
| WO | WO2004004019 | 1/2004 |

OTHER PUBLICATIONS

European Search Report dated Feb. 8, 2007.

* cited by examiner

*Primary Examiner*—Stephen W Jackson
(74) *Attorney, Agent, or Firm*—Sofer & Haroun, LLP

(57) ABSTRACT

The present invention relates to a resistive type high temperature superconductor based fault current limiter with improved heat exchange capability composed of a thermally conductive matrix material 8 with a plurality of superconductor components 5 embedded in the thermally conductive matrix material 8 wherein the plurality of superconductor components 5 is connected electrically in parallel.

18 Claims, 4 Drawing Sheets

RESISTIVE HIGH TEMPERATURE SUPERCONDUCTOR FAULT CURRENT LIMITER

RELATED APPLICATION

This application claims the benefit of priority from European Procedure Patent Application No. 06 300 925.2, filed on Sep. 5, 2006, the entirety of which is incorporated herein by reference.

FIELD OF THE INVENTION

The present invention relates to a resistive-type high temperature superconductor based fault current limiter with improved thermal management during quench.

BACKGROUND

A high temperature superconductor based fault current limiter (hts-fcl) is a device that automatically limits fault currents in high voltage networks to a low current value close to the nominal current. The benefit of such a device is that it reduces drastically the short circuit power of the high voltage network and, thus, allows to interconnect networks without increasing the short circuit power or to decrease safety margines so that other machineries connected to the network can be designed for lower short circuit power and, therefore, can be made lighter and cheaper.

A hts-fcl makes use of the fact that the high temperature superconductor material looses its superconductivity and transits from the non-resistive superconducting state to a normal state with high electrical resistivity when at least one of the critical current (Ic), the critical temperature (Tc) or the critical magnetic field (Hc) of the superconductor material is exceeded. This transition from the superconducting state to the normal resistive state is called "quenching".

In normal operation with nominal current In, that is, in the cooled state, the superconductor material is in its superconducting state with essentially zero resistance so that there is no voltage over the whole fcl—the fcl is "invisible" for the network.

In case of fault such as short circuit the current rises to several times the nominal current In exceeding Ic of the superconductor material which causes the superconducting material to transit to the normal resistive state.

The electric resistance R of a fcl in the normal resistive state is generally chosen such that the current which can pass the hts components is not more than about 2 to 6 times, preferably 2 to 3 times, of the nominal current In.

For example, in a 110 kV network the fcl should limit the current to 5.400 ampere in fault event which corresponds to the threefold of the nominal current of 1.800 ampere. Consequently the hts components should have a normal state resistance of about 20 ohms with $R_{fcl}$=Voltage/limited current.

There are known hts-fcl which are composed of a bulk component of high temperature superconductor material or of a plurality of such bulk components electrically connected in series.

Within a resistive fcl with the hts components electrically connected in series the components must be very homogenous in view of their properties such as critical current density, critical current, normal state resistivity etc. If, for example, the critical current Ic of the hts-components or of part of a single component differs quench and in the result heat up is non uniform. Such non uniform heat up would lead to the formation of a temperature gradient within the material of the hts components and in the result to breakage due to thermal shock.

Further, if only the part with lowest Ic starts to quench resistance built up in this part is insufficient to limit the fault current until also the other hts components reach their resistive state. In the consequence without the provision of suitable means such as a breaker this part will heat up and local burn-out can occur.

In general, during fault event when the high temperature superconductor material quenches the material has to absorb a large quantity of energy within a very short time of only some tens of millisecond. In the result within the components a power density is generated which is orders of magnitude too high to be transported into a cooling environment, usually cooling bath, within the necessary short time. Since sufficient heat dissipation is not possible the hts material heats up almost adiabatically until melting of the material. Thus, for avoiding heating up until melting of the material a breaker or likewise means must be provided for taking the fcl from the network.

U.S. Pat. No. 5,761,017 discloses a fault current limiter comprising high temperature superconductor filaments encapsulated in an epoxy having thermal conductivity properties that enable the superconductor do heat rapidly during fault while preventing adiabatic heat up until damage. The epoxy encapsulation serves to dissipate heat from the filaments into the encapsulation in order to avoid adiabatic heat up. On the other hand the epoxy encapsulation must have large heat capacity and insulates the superconductor filaments.

By this thermal insulation effect of the epoxy encapsulation the temperature to which the superconductor filaments are subjected is kept considerably above the critical temperature for decreasing the critical current density. Due to the decrease of critical current density quenching is promoted and overall resistance obtainable enhanced. In the consequence the epoxy encapsulation serves to thermally insulate the filaments from the cooling bath.

A further drawback of known fault current limiters is, that due to the very high power density generated inside the hts material the material can not recover to the superconducting state "under load", that is online, after quench but must be taken from the network for cooling down. However, in the result, when the hts-fcl is offline in order to avoid melting and/or for recovery to the superconducting state the network is not protected against fault events or any other additional protection equipment would be necessary.

Apart from the use as bulk material referred to above there is also known to use hts-material in form of layers, wherein a layer of the hts-material is deposited on a suitable substrate.

However, for a superconductor layer to have good superconductor properties such as high current density etc. the crystal grains of the superconductor material must have a certain degree of orientation. In particular, the crystal grains should be aligned both perpendicular to the plane of the substrate (c-axis orientation) and parallel to the plane of the substrate (a-b-orientation).

In general, techniques for obtaining hts-layers with suitable alignment (texture) are well known.

For example, there are vacuum based processes such as pulsed laser deposition, sputtering and electron beam evaporation.

A specific example for such vacuum based process is a method called IBAD (ion beam assisted deposition) wherein on randomly oriented metallic substrates a highly textured buffer layer is deposited which serves to transfer the desired texture to the superconductor layer grown on the buffer layer.

Further, according to ISD—inclined substrate deposition—texturing of a to be deposited layer is obtained by deposition under specific angle.

In addition, there are wet chemical processes such as metal organic deposition (MOD) including sol-gel method etc.

In MOD-techniques usually organic compounds of the metals constituting the superconductor material are used as precursors, dissolved in a solvent, deposited on the substrate and converted to the final hts-material by heat treatment.

Substrates with suitable texture are obtainable by RABITs (rolling assisted biaxial texturing of substrates). Such textured substrates can serve as template for transferring a desired texture to a layer deposited thereon.

OBJECTS AND SUMMARY

It was the object of the present invention to provide a hts-fcl with improved thermal management which allows prompt and sufficient heat exchange with the environment, such as a cooling reservoir, thereby preventing heating up of the hts material to melt.

It was also the object of the present invention to provide a hts-fcl which is protected against local burn-out.

Further, it was the object of the present invention to provide a hts-fcl which can automatically recover from its normal resistive state to the superconducting state under load, that is without being taken from the network.

In particular, the present invention relates to a hts-fcl which is capable of working without a breaker for avoiding excessive heat up and for allowing recovery.

According to the present invention a resistive-type hts-fcl element is provided comprising a plurality of high temperature superconductor components arranged within a matrix material of thermal conductivity, wherein the plurality of high temperature superconductor components is connected electrically in parallel to each other, and wherein the temperature Ts to which the fault current limiter heats up during fault is below room temperature.

According to a further aspect the high temperature superconductor components of the hts-fcl element of the present invention can be in the form of a hts layer, in particular, a coated conductor comprising a layer of hts material.

According to yet a further aspect, the matrix material of thermal conductivity has an outer surface provided with surface area enhancing means.

The hts-fcl of the present invention comprises a plurality of hts-components which are electrically connected in parallel.

Nominal current In to be transported is, thus, distributed over all the components and in the consequence each single component carries only a respective fraction of the overall nominal current.

Since each single hts component has to carry only a fractional part of the overall nominal current critical current Ic of the hts component can be selected to be low.

In fault event when the hts component with the lowest Ic starts quenching the current is redistributed to the other hts components connected thereto in parallel. Therefore, in the component which first starts to quench heating is only small until all the other parallel components are also in the normal resistive state. Consequently, burn-out of single components can be avoided. Further, the power density created by the fault current is shared by all the hts components connected electrically in parallel so that the maximum heat-up of the individual component is limited.

In addition, by the thermally conductive matrix material heat exchange with the environment, usually the cooling bath of the fault current limiter, is improved so that the heat generated during fault can be effectively dissipated into the cooling medium likewise within a very short time. In the result the hts component can reach a stable temperature which is below room temperature and, in particular, below the melting point of the hts material without the need of a breaker.

According to the present invention heat exchange can be further improved by providing the outer surface of the matrix material with means enhancing the surface area available for heat exchange, referred to as "surface area enhancing means".

According to the present invention by the provision of a matrix material of good thermal conductivity and the use of a plurality of hts-components a resistive type hts-fcl is obtained having improved thermal management, wherein heating-up is controlled by distributing the power density created during fault over the plurality of single hts components as well as by improved heat exchange with the environment.

Thereby not only local burn out can be avoided but also uncontrolled heat-up to a temperature until melting of the material.

Consequently, it is not necessary to provide a breaker for preventing such uncontrolled heat-up.

Further, due to the effective heat dissipation into the environment the hts material can return from the normal resistive state to its superconducting state without the need to be taken from the network.

According to the present invention due to the effective thermal management the fcl will only heat up to a certain temperature Ts below room temperature and at which the fcl is in a stable equilibrium. In order to have a sufficient driving force for heat dissipation usually the temperature Ts is selected to be above the temperature $T_B$ of the cooling bath. Preferably, $T_S$ should be considerably below room temperature.

Due to the difference between temperature Ts and the temperature $T_B$ of the cooling bath the ohmic heat produced in the hts components can be exactly conducted into the cooling bath by conduction and convection.

In addition by effective heat dissipation return of the quenched fcl its superconducting state after fault is facilitated even in case that the fcl is connected to the network—that is, online.

The desired temperature Ts of the fcl can be adjusted, for example, by selection of the number of hts components or by adjustment of the resistance of the hts components etc.

Preferably, according to the present invention Ts of the fcl should be close to the temperature of the cooling bath $T_B$. Preferably, the difference $TS-T_B$ is less than 100 K, more preferably less than 50 K, particularly less than 25 K and most preferred less than 10 K.

It has been observed that at such a Ts cooling back of the fcl to its superconducting state after fault is particularly facilitated even in case that the fcl is online.

Bearing the above in mind it is clear that the required number of hts components can vary depending on external factors such as the nominal current In, desired limited current $I_1$ etc., as well as on the specific design of the respective fcl such as matrix material, in particular heat conductivity of the matrix material, width of the hts components, surface available for heat dissipation etc.

According to a general approach the number of hts-components suitable for the present hts-fcl can be determined based on the nominal current as well as the critical current Ic of the components in accordance to the following formula:

Ic=x·nominal current/number of parallel components, with 1<x<5, preferably 1<x<2.

For the present invention, in order to keep the power density small which is created within each single hts component during fault also the critical current Ic of each hts-component should be only small.

Referring to the example set out above with a nominal current of 1800 A and Ic of 50 A according to the formula above the desired number of components should be between 36 and 72.

Consequently, in the hsc-fcl element of the present invention the number of hts-components n=x·nominal current/Ic (component), with x being preferably a value between 1 and 5 (1<x<5), in particular 1<x<2.

In view of the above, typically, a suitable number of the hts components present is of from 10 to 100, preferably more than 25, more preferably more than 50 and particularly preferred more than 75.

Further, a suitable Ic of the hts components for nowadays applications as referred to above is 50 A or less.

However, as is clear, Ic of the hts component can vary depending on the specific application and design of the fcl element.

In principle, for the present invention any hts material can be used.

An example of a suitable superconducting material is the oxide high temperature superconductor REBCO with RE being Rare Earth metal or one of the Bi, Tl or Hg superconductors can be used. Preferred is a YBCO-type superconductor, in particular YBCO-123.

Preferably the superconducting material should have a high critical current density Jc. Superconducting materials with high critical current density have a much faster switch performance than materials of low critical current density and are able to switch much faster from the superconducting to the normal resistive state when current higher than the critical current Ic is applied.

If hts materials of high critical current density are used it is possible to reduce the thickness of the hts layers in order to obtain the desired critical current of about 50 A. Preferably the critical current density of the superconducting material is 1 MA/cm$^2$ or more, more preferably from 1 to 6 MA/cm$^2$.

BRIEF DESCRIPTION OF THE DRAWINGS

In the following the present invention is explained in more detail by reference to a preferred embodiment of the hts-fcl element of the present invention and the accompanying figures showing schematically this preferred embodiment.

It is shown in FIG. 1 a cross sectional view of a coated conductor suitable for the present invention.

DETAILED DESCRIPTION

Figure 1:
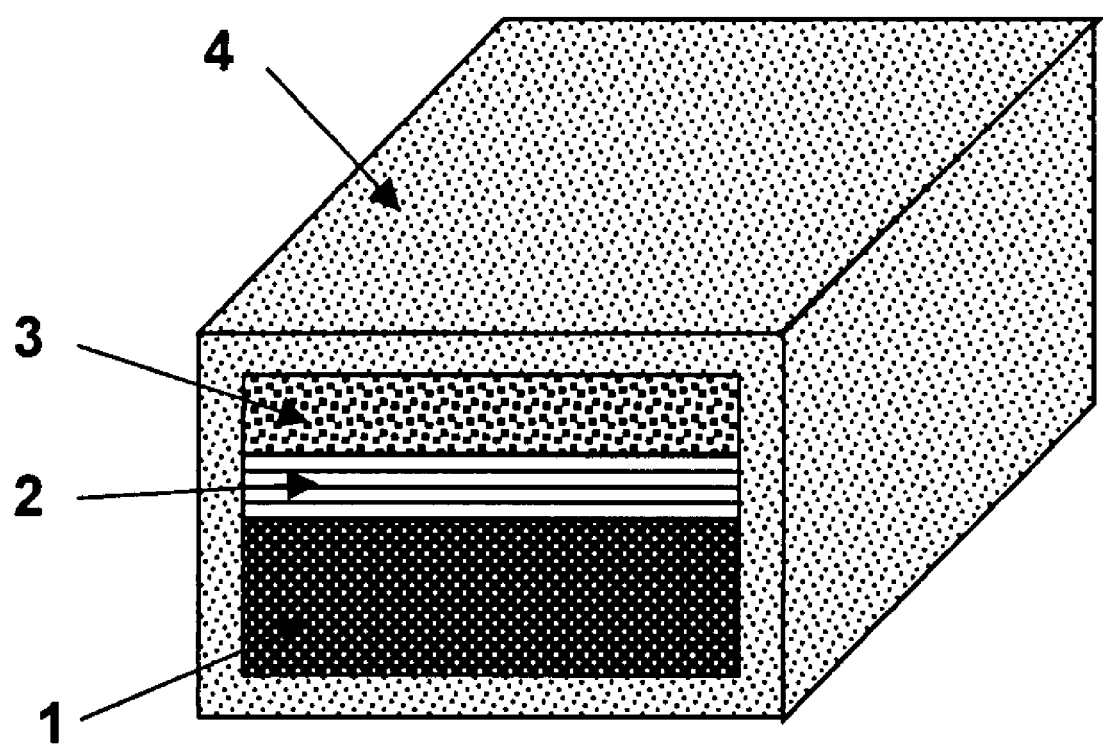

In FIG. 1 the architecture of a conventional coated conductor suitable for the present invention is shown which typically comprises a substrate 1, one or more buffer layers 2 and a high temperature superconductor layer 3.

The buffer layer(s) 2 can serve as chemical barrier to prevent interaction of the substrate 1 with the high temperature superconductor layer 3 and for transferring the desired, preferably bi-axial, orientation to the superconducting material.

For the present invention the superconducter layer 3 of each single coated conductor can be designed to have the desired low critical current as set out above.

If the critical current is only low also heat created during possible fault event is small.

The superconductor layer 3 can be electrically connected to the substrate 1 by a connection of high resistivity 4 (also referred to "connection layer"). The connection of high resistivity 4 can cover the hts layer 3 and can extend laterally towards the substrate 3.

Further, as shown in FIG. 1, connection layer 4 can also extend over the bottom surface of the substrate 1.

By the provision of the connection of high resistivity 4 the overall normal state resistance of the coated conductor is enhanced. That is, if the superconductor material quenches and transits to its normal resistive state the overall resistance of the component can be enhanced by the provision of the connection of high resistance 4 resulting in improved current restricting performance The reason therefore is that during fault event the current runs through the whole hts-component inclusive the hts layer 3, the substrate 1, the connection layer 4 and even the buffer layer(s) 2 provided that they are conductive. Since the resistances of these constituting parts of the hts component are connected in parallel it is preferred that the materials of which they are made are selected to have high resistivities in order to obtain a high overall resistance. Moreover, the higher the resistance of the hts component in its normal resistive state the lower the amount and length of component required to reach the total resistance needed for the fcl which is advantageous in terms of costs.

For illustrating the above statement the following example is given.

A substrate of 1 cm width and 25 micron thickness of Hastelloy C-276 has a resistivity of $\rho=130$ μΩcm and, consequently, a resistance of 4 Ω/m for a given substrate stripe. Since usually the superconductor layer will develop a resistivity of about 150-800 μΩcm in its normal resistive state and is only some micron thin the resistance of the superconductor layer will be much higher than that of the substrate. Consequently, in case of a fault most of the current will flow in the substrate.

In view of the above preferably the connection layer 4 has at least a similar resistivity as the substrate. Further preferably, its overall cross section should be not greater than that of the substrate.

Figure 2:
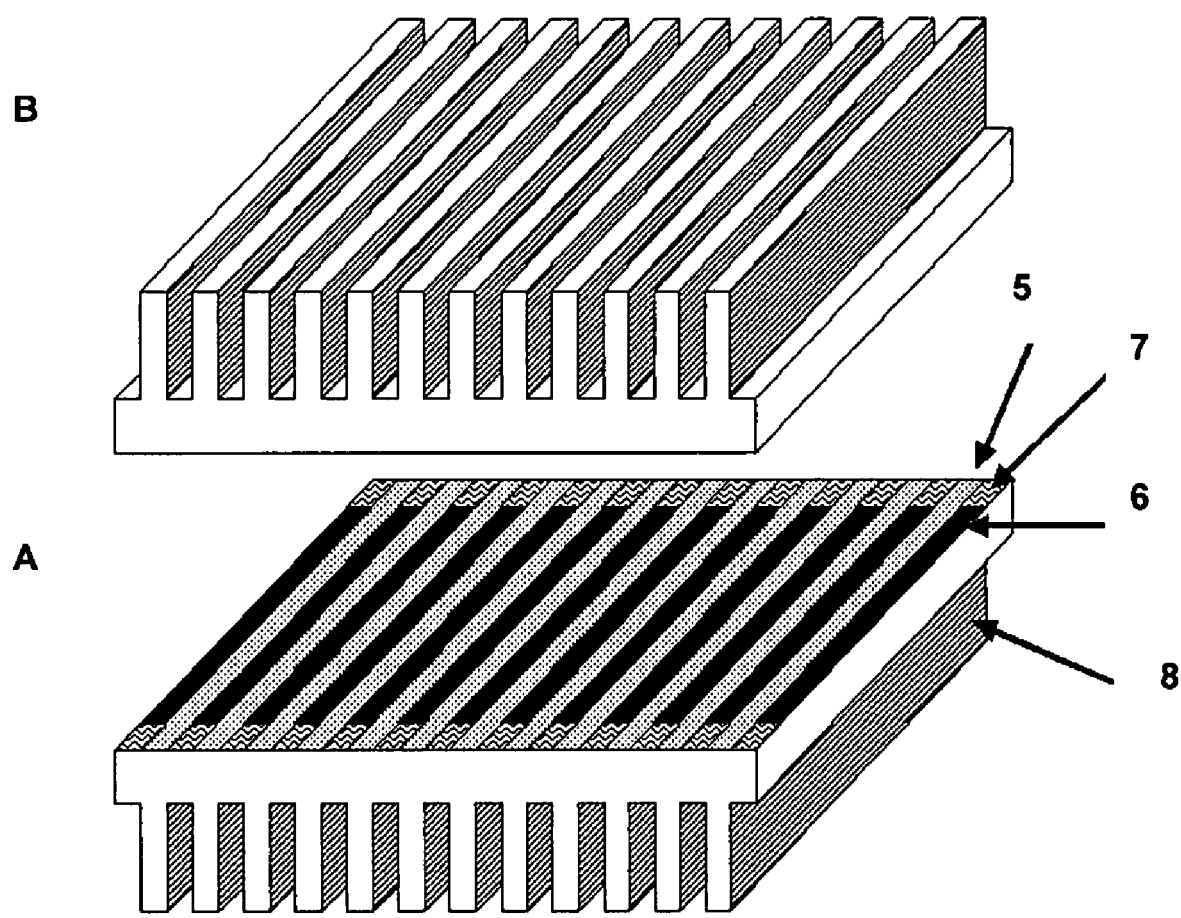
in FIG. 2 a perspective view of an elevation of a hts-fcl element of the present invention.

FIG. 2 shows a sectional view along the horizontal direction of an fault current limiter element according to the present invention. According to the embodiment shown a plurality of tapelines hts components 5 is arranged on an electrically insulating but thermally conducting layer 6. For electrically connecting each tapelike hts component in parallel at both ends of each hts component electrical contacts 7 are provided.

As shown in FIG. 2 the arrangement of hts components 5 with insulating layer 6 and electrical contact 7 is applied onto a first planar plate A made of the thermally conductive matrix material 8.

For embedding the hts components 5 into the thermally conductive matrix material 8 a second planar plate B—also provided with an insulating layer 6 of electrically insulating by thermally conductive material—is applied on top of the first planar plate A of matrix material 8 in a manner that the arrangement of hts components 5, electrical contacts 3 and insulating layers 6 are sandwiched between plates A and B.

Apart form the provision of the hts components plates A and B can be identical in design as shown in FIG. 2.

Figure 3:
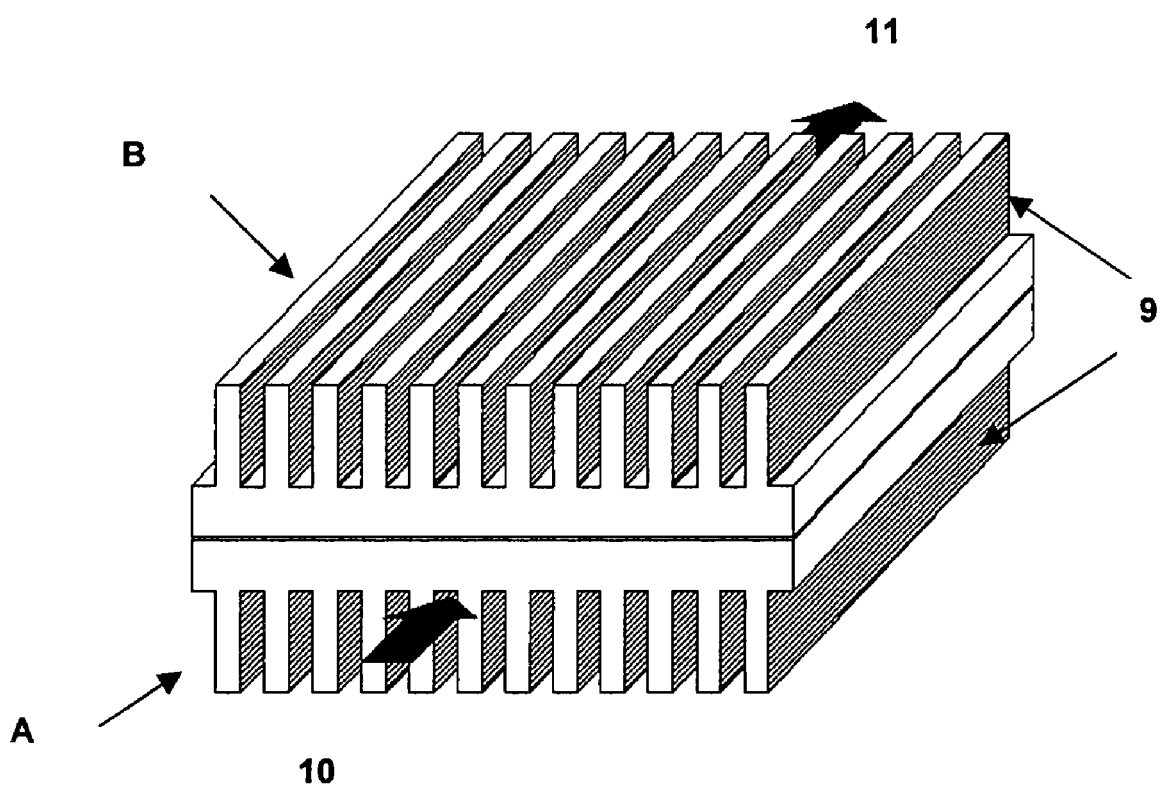
in FIG. 3 the hts-fcl of FIG. 2 in the assembled state; and in FIG. 4 a further embodiment of the present invention.

The assembled fcl element with the hts components 5 being embedded into the matrix material 8 is shown in FIG. 3.

For enhancing the heat dissipating capacity of the thermally conductive matrix material 8 the outer surface area formed of the matrix material 8 can be enlarged by providing surface area enhancing means 9.

As shown in FIGS. 2 and 3 such surface area enhancing means 9 can be in the form of fins or lamellae provided on the outer surface of the matrix material 8.

As shown in FIGS. 2 and 3 the fins or lamellae 9 can be arranged in parallel on the outer surface of the matrix material 8.

The surface area enhancing means 9, such as the fins or lamellae, can be made of the same material as the matrix material 8.

The body of matrix material with enhanced outer surface can be a single workpiece.

Figure 4:
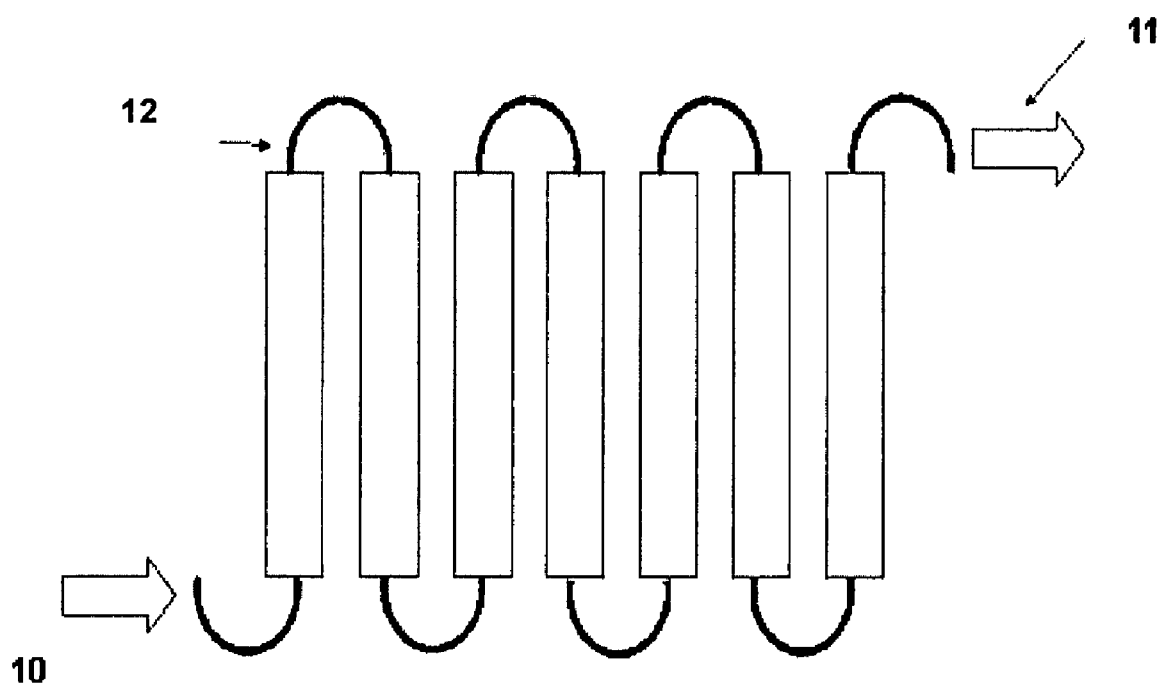

For practical use a plurality of the fault current limiter elements of the present invention can be connected in series as shown in FIG. 4. Here seven fault current limiter elements of the present invention are connected in series with incoming current indicated by arrow 10 and outgoing current indicated by arrow 11. The elements being connected to each other by current leads 12. With exception of the current leads 12 the individual fcl-elements of the assembly are electrically insulated from each other.

Examples for suitable thermally conductive materials for the matrix 8 are metals and metal alloys such as Cu, Al, Ag, Au, AlN, BeO, SiC, $Al_2O_3$, diamond, diamondlike carbon etc. and combinations thereof.

If a thermally conductive material is used for the matrix which is also sufficiently electrically insulating such as AlN insulating layer 6 can be omitted.

Otherwise, if the matrix material as such is not sufficiently electrically insulating a layer 6 made of electrically insulating but thermally conductive material should be provided. Suitable materials for the layer 6 are AlN, BeO, diamond, $Al_2O_3$ etc.

According to the present invention by provision of the matrix material 8, preferably together with surface enhancing means 9, the overall surface available for heat exchange such as convection can be enhanced for example at least by the ten-fold and at least by the twenty-fold. For example, an enhancement by at least the 20-fold to the 40-fold can be suitable for nowadays applications.

Due to the high surface area of the matrix material, in particular in case of the provision of surface area enhancing means, convective heat exchange with the environment, usually the cooling bath, can be drastically enhanced and heat dissipation is increased.

The hts component 5 can be a tape as shown in the figures or a wire or the like made of superconductor material.

The superconductor component can be a layer such as a thin film applied in form of a stripe.

In order to form the hts component the superconductor material can be applied as such, for example provided directly onto the matrix material 8 or onto any layer 6.

Preferably, the hts component 5 is a coated conductor, for example, a coated conductor as shown in FIG. 1.

The production and adjustment of Ic of the superconductor material such as coated conductors and of suitable layers is well-known to those skilled in the art.

According to the present invention the hts component 5 is embedded in the matrix material 8, wherein each of the plurality of hts components is substantially completely surrounded by the matrix material 8.

The shape of the matrix material 8 is not particularly restricted and can be selected according to need, for example to fit as optimally as possible to the assembly into which it is intended to be integrated.

The cross-section of the body formed by the matrix material can be rectangular, oval, round or the like or any combination thereof.

The matrix material can have the shape of a rectangular block, e.g. as in the figures, or of a round or oval cylinder.

The arrangement of the plurality of superconductor components 5 within the matrix material 8 should be such that sufficient heat dissipation is possible.

In view of sufficient heat dissipation an arrangement as shown in FIG. 2 is particularly suitable with the plurality of superconductor components being arranged in-plane. However, provided that sufficient heat dissipation is possible, any other arrangement can be also applied, such as a more or less regular arrangement throughout the cross-section of the matrix material.

According to the present invention the matrix material 8 is provided with surface area enhancing means 9. That surface enhancing means 9 provide an enlarged surface area for heat exchange. As shown in the figures the surface area enhancing means 9 can have the form of fins or lamellae extending along the surface of the matrix material.

As shown in FIG. 2 or 3 the surface area enhancing means 9 can extend along the longitudinal extension of the hts components 5. Preferably, below and above each hts component 5 such a surface area enhancing means 9 is provided.

By the arrangement as shown in FIGS. 2 and 3 optimal heat transport is possible.

With respect to the shape and dimensions of the surface area enhancing means 9 there is no particular restriction.

Suitable examples are fins or lamellae as shown in FIGS. 2 and 3.

The particular dimensions of these fins or lamellae such as longitudinal extension (length), height, width at the top and width at the bottom can be selected according to need in order to ensure suitable heat dissipation of the particular design of the fault current limiter element.

For example, the cross-sectional area of the fin can be trapezoid with the top width being smaller than the bottom width. Further, the top surface can be planar, curved, provided with grooves etc.

The same applies to the design of the lateral surfaces of such fins.

The resistive type hts fcl according to the present invention can reach a stable temperature, preferably below room temperature, during fault when the limited current reaches its pre-determined value above the nominal current In. In principle the fcl of the present invention can operate indefinitely during fault—only depending on the heat capacity of the cooling reservoir.

After the fault has been cleared and the current returns to its nominal value, the fcl of the present invention can cool down automatically below its Tc and, thus, return to its superconducting state.

In designing the present hts fcl element particular parameters are the heat conductivity of the matrix material, the surface available for convective heat exchange with the environment and the number of hts components connected in parallel which defines the power density created in each of the hts components.

The invention claimed is:

1. Resistive type high temperature superconductor fault current limiter element comprising:

a plurality of high temperature superconductor components embedded within a thermally conductive matrix material, wherein the plurality of high temperature superconductor components are connected electrically in parallel to each other, and wherein the temperature $T_s$ to which the fault current limiter heats up during fault is below room temperature.

2. Resistive type high temperature superconductor fault current limiter element according to claim 1, wherein the high temperature superconductor component is formed of stripe-like layers of high temperature superconductor material.

3. Resistive type high temperature superconductor fault current limiter element according to claim 1, wherein the high temperature superconductor component is a coated conductor.

4. Resistive type high temperature superconductor fault current limiter element according to claim 1, wherein the plurality of high temperature superconductor components are arranged in-plane and in parallel to each other within the matrix material.

5. Resistive type high temperature superconductor fault current limiter element according to claim 1, wherein on the outer surface of the matrix material surface area enhancing means are provided for increasing the surface available for heat dissipation.

6. Resistive type high temperature superconductor fault current limiter element according to claim 5, wherein the surface area enhancing means are fins or lamellae extending along the surface of the matrix material.

7. Resistive type high temperature superconductor fault current limiter element according to claim 5, wherein the surface area enhancing means extend along the high temperature superconductor components.

8. Resistive type high temperature superconductor fault current limiter element according to claim 7, wherein the surface area enhancing means extend below and above each superconductor component.

9. Resistive type high temperature superconductor fault current limiter element according to claim 1, wherein the number of high temperature superconductor components n is $n = x \cdot \text{nominal current}/\text{Ic (component)}$ with x being a value between 1 and 5, and Ic critical current.

10. Resistive type high temperature superconductor fault current limiter element according to claim 1, wherein the number of high temperature superconductor components is selected of from 10 to 100.

11. Resistive type high temperature superconductor fault current limiter element according to claim 1, wherein by the matrix material the surface area available for heat dissipation is enhanced by at least the tenfold.

12. Resistive type high temperature superconductor fault current limiter element according to claim 1, wherein the element is capable to recover from the normal resistive state to the superconducting state under load.

13. Method for improving heat dissipation of a resistive type high temperature superconductor fault current limiter element comprising the steps of
  embedding a plurality of n high temperature superconductor components within a thermally conductive matrix material;
  connecting the plurality of n high temperature superconductor components electrically in parallel, wherein heat is dissipated from the high temperature superconductor components via the matrix material into the environment; and
  wherein during fault the fault current limiter is heated up to a temperature $T_s$ below room temperature, and wherein $T_s$ is above the temperature $T_B$ of the cooling medium.

14. Method according to claim 13, wherein on the outer surface of the matrix material surface area enhancing means are provided for increasing the surface area available for heat exchange.

15. Method according to claim 13, wherein the difference $T_S - T_B$ is less than 100 K.

16. Resistive type high temperature superconductor fault current limiter element according to claim 1, wherein an electrically insulating layer is provided for electrically insulating the plurality of high temperature superconductor components towards the thermally conductive matrix material.

17. Resistive type high temperature superconductor fault current limiter element comprising:
  a plurality of high temperature superconductor components embedded within a thermally conductive matrix material;
  wherein the plurality of high temperature superconductor components is connected electrically in parallel to each other;
  wherein the temperature $T_S$ to which the fault current limiter heats up during fault is below room temperature, and
  wherein by the matrix material the surface area available for heat dissipation is enhanced by at least the ten fold.

18. Resistive type high temperature superconductor fault current limiter element comprising:
  a plurality of high temperature superconductor components embedded within a thermally conductive matrix material;
  wherein the plurality of high temperature superconductor components is connected electrically in parallel to each other;
  wherein the temperature $T_s$ to which the fault current limiter heats up during fault is below room temperature; and
  wherein the high temperature superconductor component is selected from a stripe-like layer of high temperature superconductor material and a coated conductor.

* * * * *